United States Patent
Suzuki (10) Patent No.: US 11,395,445 B2
(45) Date of Patent: Jul. 19, 2022

(54) POWER CONVERTER AND RAILROAD VEHICLE

(71) Applicants: Kabushiki Kaisha Toshiba, Minato-ku (JP); Toshiba Infrastructure Systems & Solutions Corporation, Kawasaki (JP)

(72) Inventor: Satoko Suzuki, Shinjuku (JP)

(73) Assignees: Kabushiki Kaisha Toshiba, Minato-ku (JP); Toshiba Infrastructure Systems & Solutions Corporation, Kawasaki (JP)

( * ) Notice: Subject to any disclaimer, the term of this patent is extended or adjusted under 35 U.S.C. 154(b) by 102 days.

(21) Appl. No.: 16/890,094

(22) Filed: Jun. 2, 2020

(65) Prior Publication Data

US 2020/0298707 A1    Sep. 24, 2020

Related U.S. Application Data (63) Continuation of application No. PCT/JP2018/043389, filed on Nov. 26, 2018.

(30) Foreign Application Priority Data

Dec. 4, 2017  (JP) .............................. JP2017-232546

(51) Int. Cl.
*H05K 7/20* (2006.01)
*B60L 9/24* (2006.01)

(52) U.S. Cl.
CPC ......... *H05K 7/209* (2013.01); *H05K 7/20336* (2013.01); *H05K 7/20927* (2013.01);
(Continued)

(58) Field of Classification Search
None
See application file for complete search history.

(56) References Cited

U.S. PATENT DOCUMENTS 5,424,915 A * 6/1995 Katooka ............ H05K 7/20909
361/695
5,631,821 A * 5/1997 Muso ................. H05K 7/20927
361/709

(Continued)

FOREIGN PATENT DOCUMENTS

JP   2003-48533 A    2/2003
JP   2012-151342 A   8/2012

(Continued)

OTHER PUBLICATIONS

Extended European Search Report dated Jul. 30, 2021 in corresponding European Patent Application No. 18886911.9 citing documents AA and AO therein, 8 pages.

(Continued)

*Primary Examiner* — Courtney L Smith
(74) *Attorney, Agent, or Firm* — Oblon, McClelland, Maier & Neustadt, L.L.P.

(57) ABSTRACT

A power converter includes: a plurality of semiconductor devices; a heat receiving plate; and a first partition member. The semiconductor devices constitute a power conversion unit. The heat receiving plate includes a first surface supporting the semiconductor devices. The first partition member is fixed to the heat receiving plate and partitions the semiconductor devices.

17 Claims, 9 Drawing Sheets

(52) U.S. Cl.
CPC ............ *H05K 7/20936* (2013.01); *B60L 9/24* (2013.01); *B60L 2200/26* (2013.01); *B60L 2210/20* (2013.01)

(56) References Cited

U.S. PATENT DOCUMENTS

| | | | | |
|---|---|---|---|---|
| 6,320,776 | B1* | 11/2001 | Kajiura | H02M 7/003 |
| | | | | 361/709 |
| 9,192,079 | B2* | 11/2015 | Loth | H05K 7/20918 |
| 9,474,189 | B2* | 10/2016 | Kawauchi | H05K 5/06 |
| 10,856,441 | B1* | 12/2020 | Huang | H05K 7/20727 |
| 2007/0279863 | A1* | 12/2007 | Illerhaus | H02J 7/35 |
| | | | | 361/695 |
| 2009/0273918 | A1* | 11/2009 | Falicoff | F21V 7/0025 |
| | | | | 362/84 |
| 2014/0204550 | A1* | 7/2014 | Kataoka | H05K 1/0218 |
| | | | | 361/765 |
| 2014/0254097 | A1* | 9/2014 | Kohn | G06F 1/20 |
| | | | | 361/697 |
| 2017/0150640 | A1 | 5/2017 | Yamanaka et al. | |
| 2017/0317256 | A1* | 11/2017 | Tetz | H01L 33/64 |
| 2018/0096912 | A1* | 4/2018 | de Sousa | H05K 1/0272 |
| 2021/0105912 | A1* | 4/2021 | Takabayashi | H05K 7/209 |

FOREIGN PATENT DOCUMENTS

| | | |
|---|---|---|
| JP | 2012-204366 A | 10/2012 |
| JP | 2013-71482 A | 4/2013 |
| WO | WO 2008/071192 A1 | 6/2008 |

OTHER PUBLICATIONS

International Search Report dated Feb. 12, 2019 in PCT/JP2018/043389 filed Nov. 26, 2018, citing documents AO-AQ therein, 2 apges.

* cited by examiner

POWER CONVERTER AND RAILROAD VEHICLE

CROSS-REFERENCE TO RELATED APPLICATION

This is a Continuation Application of International Application No. PCT/JP2018/043389, filed on Nov. 26, 2018, which claims priority to Japanese Patent Application No. 2017-232546, filed on Dec. 4, 2017, and the entire contents of all of the aforementioned applications are incorporated herein by reference.

FIELD

Embodiments described herein relate generally to a power converter and a railroad vehicle.

BACKGROUND

A railroad vehicle may be provided with a power converter. In such a power converter, a semiconductor device that carries out a switching operation and an electrical device such as a resistor constitute a power conversion unit.

Heat is generated from the semiconductor device due to the switching operation of the semiconductor device. In order to effectively carry out heat dissipation from the semiconductor device, heat dissipation from the heat receiving plate fixed to the semiconductor device has been studied.

In order to operate the power converter even in a case where the semiconductor device fails to operate properly, the power converter may include a plurality of semiconductor devices that are provided in parallel.

When a semiconductor device fails to operate properly, the failed semiconductor device is shattered and scattered. Accordingly, it is preferable to prepare a heat receiving plate for each of the semiconductor devices and ensure a distance between the semiconductor devices. With this configuration, the failed semiconductor device is less likely to affect another semiconductor device.

However, when a heat receiving plate for each of the semiconductor devices is prepared, a plurality of heat receiving plates are necessary. Furthermore, when semiconductor devices are attached to both surfaces of a heat receiving plate, a space for ensuring semiconductor devices in a power converter becomes larger. Accordingly, conventionally, a power converter is configured so that a plurality of semiconductor devices are attached to a first surface of one heat receiving plate.

However, in the aforementioned power converter, when one of the semiconductor devices fails to operate properly and the failed semiconductor device is shattered and scattered, there is a concern that another semiconductor device will be damaged.

DETAILED DESCRIPTION

According to one embodiment, a power converter includes: a plurality of semiconductor devices; a heat receiving plate; and a first partition member. The semiconductor devices constitute a power conversion unit. The heat receiving plate has a first surface supporting the semiconductor devices. The first partition member is fixed to the heat receiving plate and partitions the semiconductor devices.

Hereinafter, a power converter and a railroad vehicle according to an embodiment will be described with reference to drawings.

Hereinbelow, an embodiment of a railroad vehicle will be described with reference to FIGS. 1 to 9.

Figure 1:
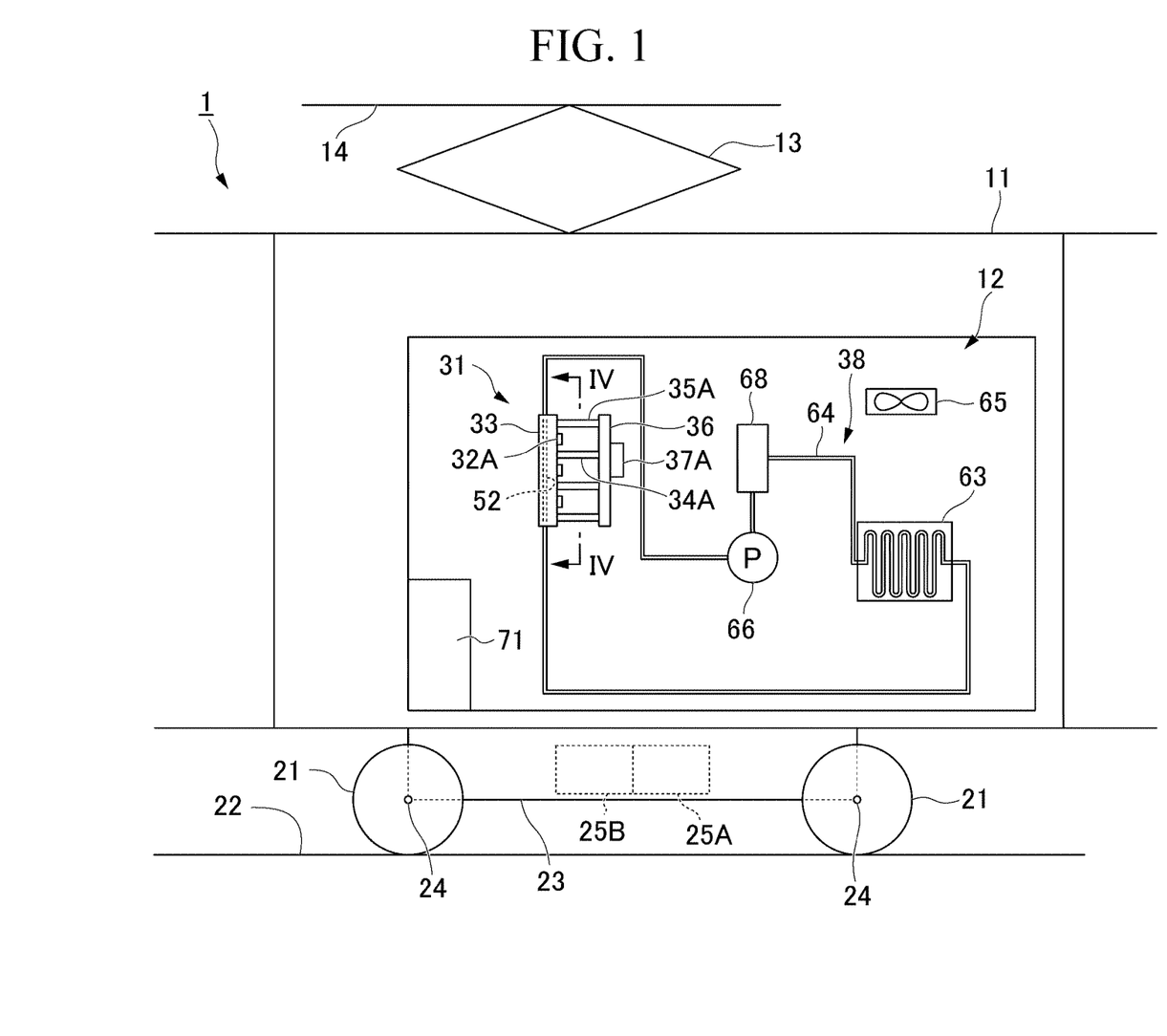
FIG. 1 is a side view schematically showing a railroad vehicle according to an embodiment.

As shown in FIG. 1, a railroad vehicle 1 according to the embodiment includes: a vehicle body 11, wheels 21, a power converter 31 according to the embodiment, and a controller 71.

For example, the vehicle body 11 is formed in a long rectangular parallelepiped shape in a direction in which rails 22 extend. A machine room 12 is formed in the vehicle body 11. The power converter 31 is provided in the machine room 12. A pantograph 13 that is directed upward is provided on an upper surface of the vehicle body 11. The pantograph 13 is disposed to be able to come into contact with an overhead line 14 from the lower side of the overhead line 14. The pantograph 13 is connected to the power converter 31 via electric wires 42 (refer to FIG. 2) or the like.

Particularly, in the explanation of the embodiment, electrical power is supplied to the power converter 31 from the overhead line 14 via the pantograph 13. However, electrical power may be supplied to the power converter 31 from a power generator or an electric storage device which are mounted on a railroad vehicle.

The wheels 21 are spaced apart at a distance to each other in a width direction of the vehicle body 11. The wheels 21 are disposed on the rails 22. The wheels 21 are rotatably supported around a rotation shaft 24 provided on a truck 23. The truck 23 is fixed to a bottom surface of the vehicle body 11.

Electric motors 25A and 25B are coupled to the rotation shaft 24 via a gear box or the like which is not shown in the drawings. The electric motors 25A and 25B are connected to the power converter 31 via electric wires 48 and 49 (refer to FIG. 2), respectively, which will be described later. In accordance with input of alternating electric power from the power converter 31, the electric motors 25A and 25B rotate the rotation shaft 24 via the gear box or the like. In the example, both the electric motors 25A and 25B can rotate the rotation shaft 24.

Figure 3:
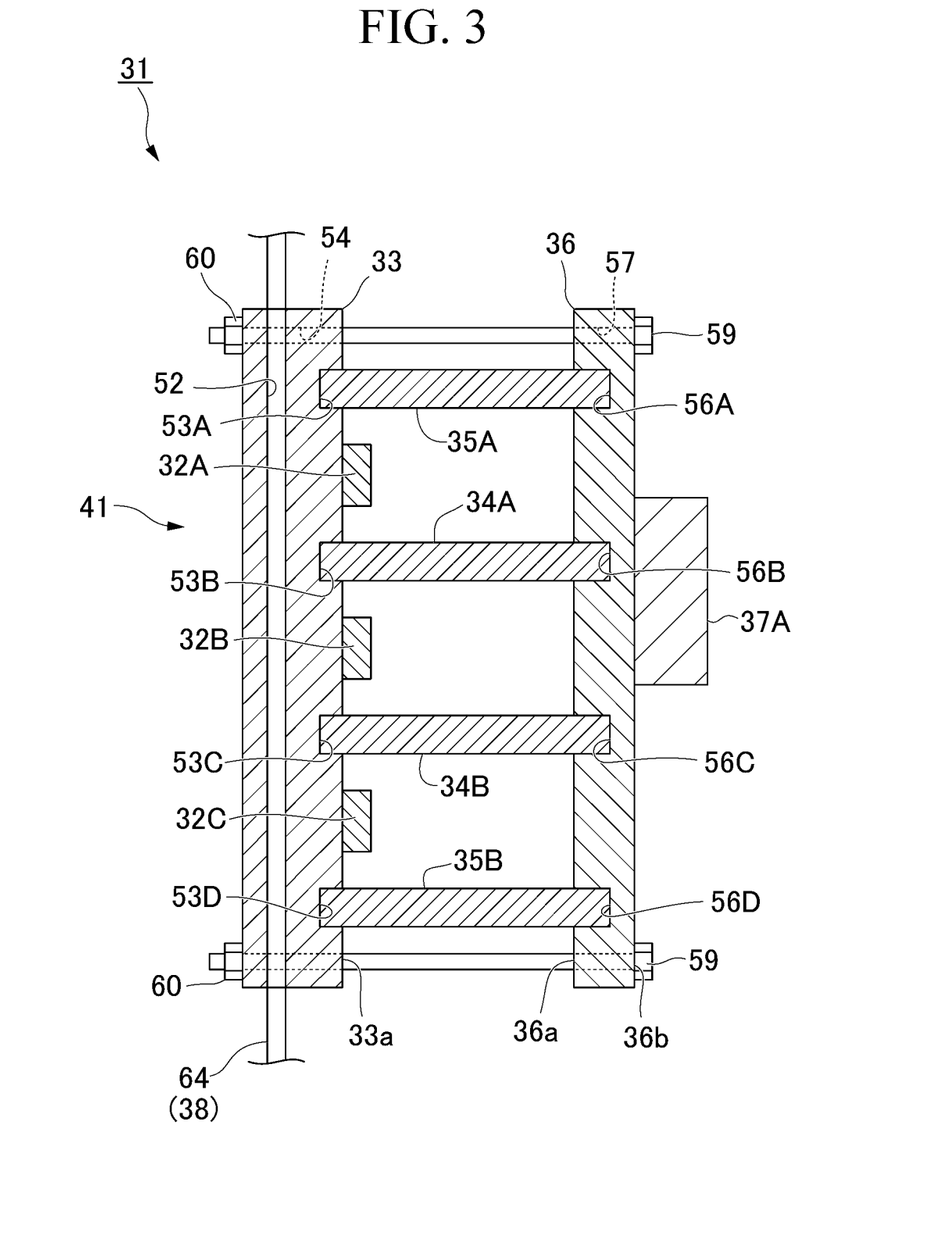
FIG. 3 is a cross-sectional view showing a relevant part of a power converter of the railroad vehicle according to an embodiment when viewed from a lateral side.

As shown in FIGS. 1 and 3, the power converter 31 includes: a plurality of semiconductor devices 32A, 32B, and 32C, a heat receiving plate 33, first partition plates (first partition member) 34A and 34B, second partition plates (second partition member) 35A and 35B, a cover 36, a first electrical device 37A, and a heat sink 38.

Hereinbelow, the semiconductor devices 32A, 32B, and 32C may be simply referred to as the semiconductor devices 32A to 32C. The same applies to first grooves 53A, 53B, 53C, 53D, or the like which will be described later.

Figure 2:
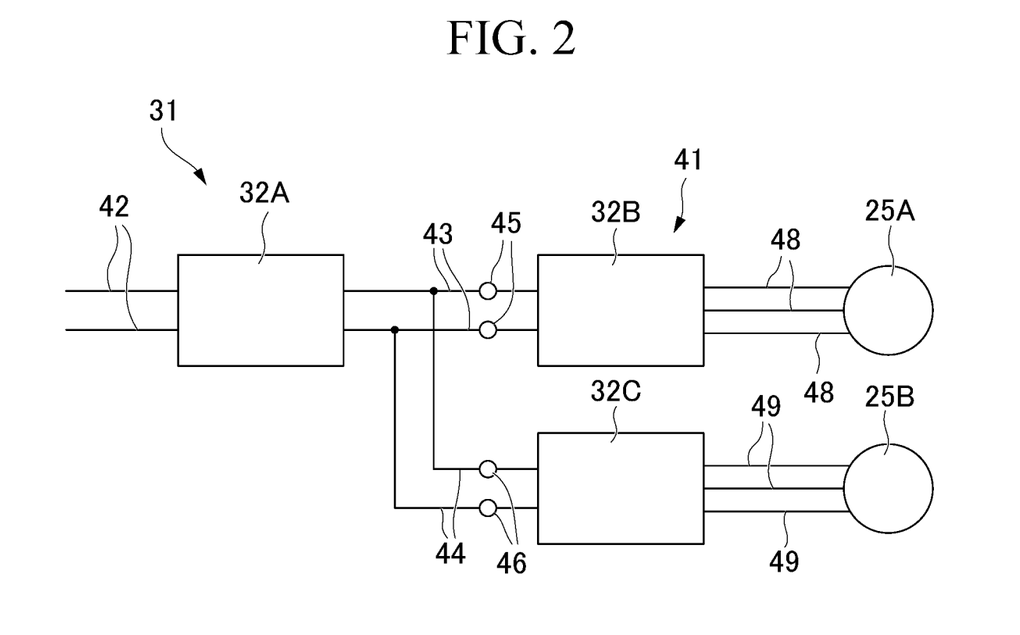
FIG. 2 is a block diagram showing a power conversion unit of a railroad vehicle according to an embodiment.

In this example, as shown in FIG. 2, the semiconductor device 32A constitutes a converter, each of the semiconductor devices 32B and 32C constitutes an inverter. Note that, the power conversion unit 41 is configured to include the semiconductor devices 32A to 32C. The semiconductor device 32A that constitutes the converter converts an alternating current that is transmitted via the electric wires 42 from the pantograph 13 into a direct current. The semiconductor devices 32B and 32C that constitute the inverter are connected in parallel to the semiconductor device 32A that constitutes the converter via the electric wires 43 and 44. The semiconductor devices 32B and 32C that constitute the inverter convert a direct current into an alternating current.

Note that, in this example, the semiconductor device that constitutes the converter or the inverter is represented as one package. However, a module (package) may be configured by a plurality of semiconductor devices such as various phases, various upper and lower arms, or the like.

Opening switches 45 and 46 are provided on the electric wires 43 and 44, respectively. The opening switch 45 can switch between a closed state where an electrical current flows to the electric wire 43 and an open state where electrical current does not flow to the electric wire 43. The opening switch 46 can switch between a closed state and an open state with respect to the electric wire 44 in a manner similar to the opening switch 45.

It is preferable that a current sensor that measures an alternating current value converted by the semiconductor devices 32B and 32C be attached to the semiconductor devices 32B and 32C. The current sensor is used to detect whether or not the semiconductor devices 32B and 32C fail to operate properly. However, a sensor that detects failure of the semiconductor devices 32B and 32C is not limited to the above. The current sensor transmits a detection result to the controller 71.

The semiconductor device 32B is connected to the electric motor 25A by the electric wires 48. The semiconductor device 32C is connected to the electric motor 25B by the electric wires 49.

Note that, the number of the electric motors driven by the power converter 31 is not particularly limited, and may be two, or four or more. For example, when an induction electric motor is driven by the power converter 31, a plurality of induction electric motors may be driven by the semiconductor devices that constitute the inverter. Moreover, when synchronous electric motors are driven by the power converter 31, the semiconductor devices that constitute the inverters having the same number as the synchronous electric motors may be provided and driven.

Figure 4:
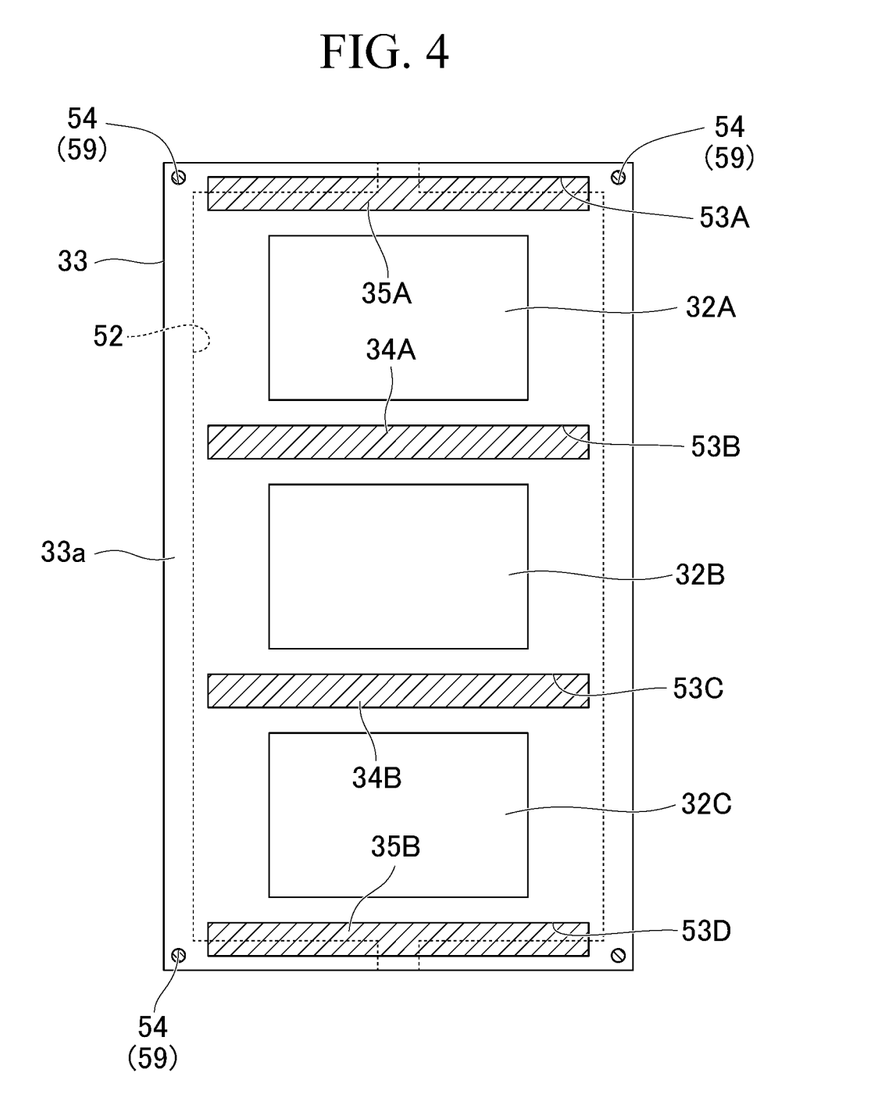
FIG. 4 is a cross-sectional view taken along the line IV-IV shown in FIG. 1.

As shown in FIG. 4, for example, the heat receiving plate 33 is formed in a rectangle shape in front view in a thickness direction. As shown in FIGS. 3 and 4, a flow path 52 is formed in the heat receiving plate 33. The flow path 52 is formed at a center portion of the heat receiving plate 33 when seen in a front view. The flow path 52 extends in a longitudinal direction of the heat receiving plate 33. Note that, when seen in a front view, the widths of the inlet and exit ports of the flow path 52 are preferably narrower than the width of the center portion of the flow path 52 in the longitudinal direction thereof. For example, the heat receiving plate 33 is disposed such that the longitudinal direction thereof extends in a vertical direction.

A heat-transfer enhancing member such as a corrugated fin or the like which is not shown in the drawings is disposed in the flow path 52. The heat-transfer enhancing member is fixed to an inner surface of the flow path 52.

The first grooves 53A, 53B, 53C, and 53D are formed on a first surface 33a of the heat receiving plate 33. The first grooves 53A to 53D extend in the width direction of the heat receiving plate 33 and are spaced apart at a distance to each other in the longitudinal direction of the heat receiving plate 33. The first grooves 53A to 53D are arranged to align in this order in the longitudinal direction of the heat receiving plate 33. The first grooves 53A to 53D do not reach each end of the heat receiving plate 33 in the width direction thereof. The first grooves 53A to 53D do not reach the flow path 52 inside the heat receiving plate 33 (refer to FIG. 3).

Through-holes 54 are formed at the respective four corners of the heat receiving plate 33. The through-holes 54 penetrate through the heat receiving plate 33 in the thickness direction thereof. When seen in a front view of the heat receiving plate 33, the through-holes 54 are located at an outer side of the flow path 52.

The heat receiving plate 33 is formed of a metal having a high coefficient of thermal conductivity, for example, aluminum, copper, or the like. When the heat receiving plate 33 is formed of aluminum, it is possible to further reduce weight of the heat receiving plate 33.

The semiconductor device 32A is supported by the portion between the first groove 53A and the first groove 53B on the first surface 33a of the heat receiving plate 33. For example, the semiconductor device 32A is fixed to the first surface 33a of the heat receiving plate 33 via heat conducting grease.

Similarly, the semiconductor device 32B is supported by the portion between the first groove 53B and the first groove 53C on the first surface 33a of the heat receiving plate 33. The semiconductor device 32C is supported by the portion between the first groove 53C and the first groove 53D on the first surface 33a of the heat receiving plate 33. The semiconductor devices 32A to 32C are arranged to align in this order in the longitudinal direction of the heat receiving plate 33.

It is preferable that, when seen in a front view, the semiconductor devices 32A to 32C be arranged at a region on which the flow path 52 is formed.

As shown in FIG. 3, the cover 36 is formed in a plate shape similar to that of the heat receiving plate 33. The cover 36 is disposed so as to face the first surface 33a of the heat receiving plate 33 and to be parallel to the heat receiving plate 33. The cover 36 and the heat receiving plate 33 hold the first partition plates 34A and 34B and the second partition plates 35A and 35B therebetween.

Second grooves 56A, 56B, 56C, and 56D are formed on a first surface 36a of the cover 36 which faces the first surface 33a of the heat receiving plate 33. The second grooves 56A to 56D are formed similarly to the first grooves 53A to 53D and are located so as to face the first grooves 53A to 53D, respectively.

Through-holes 57 are formed at the respective four corners of the cover 36.

The second partition plate 35A is fitted into the first groove 53A of the heat receiving plate 33 and the second groove 56A of the cover 36 and is thereby fixed to the heat receiving plate 33 and the cover 36. Similarly, the first partition plate 34A is fitted into the first groove 53B of the heat receiving plate 33 and the second groove 56B of the cover 36 and is thereby fixed to the heat receiving plate 33 and the cover 36. The first partition plate 34B is fitted into the first groove 53C of the heat receiving plate 33 and the second groove 56C of the cover 36 and is thereby fixed to the heat receiving plate 33 and the cover 36. The second partition plate 35B is fitted into the first groove 53D of the heat receiving plate 33 and the second groove 56D of the cover 36 and is thereby fixed to the heat receiving plate 33 and the cover 36.

Each of the first partition plates 34A and 34B and the second partition plates 35A and 35B is disposed on the first surface 33a of the heat receiving plate 33 and the first surface 36a of the cover 36. The first partition plates 34A and 34B and the second partition plates 35A and 35B are disposed such that the thickness directions thereof are along the longitudinal direction of the heat receiving plate 33.

The first partition plate 34A partitions the semiconductor device 32A and the semiconductor device 32B. Similarly, the first partition plate 34B partitions the semiconductor device 32R and the semiconductor device 32C. The pair of the second partition plates 35A and 35B are disposed so as to sandwich the entirety of the semiconductor devices 32A to 32C therebetween in the longitudinal direction of the heat receiving plate 33.

A material used to form the first partition plates 34A and 34B and the second partition plates 35A and 35B is a metal such as aluminum or resin or the like, and is not particularly limited. The same applies to a material used to form the cover 36. The cover 36 may be formed of an electrically insulating material.

The heat receiving plate 33 and the cover 36 are fixed to each other by bolts 59 and screw nuts 60. Specifically, each of the bolts 59 is inserted through the through-hole 57 of the cover 36 and the through-hole 54 of the heat receiving plate 33. The screw nuts 60 are fitted to the bolts 59 that protrude from the heat receiving plate 33 on the opposite side of the cover 36. The heat receiving plate 33 and the cover 36 which hold the first partition plates 34A and 34B and the second partition plates 35A and 35B therebetween are held by the bolts 59 and the screw nuts 60 in the thickness direction thereof.

Note that, the second partition plate may be provided so as to close an opening formed in the width direction of the heat receiving plate 33 by the heat receiving plate 33, the cover 36, and the second partition plates 35A and 35B.

The first electrical device 37A is fixed to a second surface 36b of the cover 36 on the opposite side of the semiconductor devices 32A to 32C. For example, the first electrical device 37A is a circuit for driving the semiconductor devices 32A to 32C. The first electrical device 37A is electrically connected to the semiconductor devices 32A to 32C and controls the semiconductor devices 32A to 32C.

The heat sink 38 cools down the heat receiving plate 33 by cooling fluid such as water or the like. As shown in FIG. 1, the heat sink 38 includes: a heat exchanger 63; a pipe 64; a blower (air machine) 65; and a pump 66.

As the heat exchanger 63, a freely selected heat exchanger such as of a finned tube type or the like is used. The heat exchanger 63 carries out heat dissipation from the cooling fluid flowing in the flow path 52 of the heat receiving plate 33. The pipe 64 is connected to the flow path 52 of the heat receiving plate 33 and the heat exchanger 63 in series. It is preferable that a tank 68 that stores the cooling fluid be provided to the pipe 64.

As the blower 65, a freely selected fan such as a turbo fan, a sirocco fan, or the like is used. The blower 65 is disposed so as to face the heat exchanger 63 and causes air to flow to the heat exchanger 63. The pump 66 causes the cooling fluid to flow to the pipe 64.

As described above, in the power converter 31, the heat receiving plate 33 is cooled down by the heat sink 38 having a so-called liquid circulation cooling system.

The controller 71 includes a CPU (Central Processing Unit), memory, or the like. The controller 71 controls the entirety of the railroad vehicle 1. The opening switches 45 and 46, the blower 65, the pump 66, or the like are connected to the controller 71. Based on a current value transmitted from the current sensor, the controller 71 determines whether or not the semiconductor devices 32B and 32C failed to operate properly.

Next, operation of the railroad vehicle 1 configured as described above will be described. Note that, in an initial state, the opening switches 45 and 46 are in a closed state.

When an alternating current is supplied to the semiconductor device 32A of the power converter 31 from the overhead line 14 via the pantograph 13 and the electric wires 42, the semiconductor devices 32A to 32C are driven by the first electrical device 37A. The semiconductor device 32A converts the alternating current into a direct current. The converted direct current is supplied to each of the semiconductor devices 32B and 32C via the electric wires 43 and 44, respectively. The semiconductor device 32B converts the direct current into an alternating current and supplies the converted alternating current to the electric motor 25A. The electric motor 25A rotates the rotation shaft 24 via a gear box or the like. The wheels 21 rotate on the rails 22.

Similarly, the electric motor 25B rotates the wheels 21 through the alternating current converted by the semiconductor device 32C. As mentioned above, the railroad vehicle 1 runs as a result of driving power of the electric motors 25A and 25B.

The current sensor periodically transmits the alternating current value converted by the semiconductor devices 32B and 32C to the controller 71.

The semiconductor devices 32A to 32C generate heat when power conversion is carried out. The controller 71 drives the blower 65 and the pump 66.

The heat generated from the semiconductor devices 32A to 32C is transferred to the cooling fluid inside the flow path 52 via the heat receiving plate 33 and the heat-transfer enhancing member. When the heat is transferred to the cooling fluid, the semiconductor devices 32A to 32C are cooled down.

The cooling fluid that was heated inside the flow path 52 flows to the inside of the pipe 64 by means of the pump 66 and flows into the inside of the heat exchanger 63. As the blower 65 causes air inside the machine room 12 to flow to the heat exchanger 63, the heat from the cooling fluid is transferred to the air via the heat exchanger 63. In this manner, the air inside the machine room 12 is heated, and the cooling fluid inside the heat exchanger 63 is cooled down. The cooling fluid that was cooled down in the heat exchanger 63 flows to the inside of the pipe 64 and re-flows into the inside of the flow path 52 of the heat receiving plate 33.

Note that, in the case where an amount of the cooling fluid flowing in the pipe 64 is reduced, cooling fluid is supplied from the inside of the tank 68 to the inside of the pipe 64.

For example, it is supposed that the semiconductor device 32C fails to operate properly while the railroad vehicle 1 is running. Although the failed semiconductor device 32C is shattered and scattered, since the power converter 31 includes the first partition plates 34A and 34B, the semiconductor device 32C that was shattered and scattered and directed toward the semiconductor devices 32A and 32B is blocked by the first partition plates 34A and 34B.

Additionally, since the power converter 31 includes the second partition plate 35B, the semiconductor device 32C that was shattered and scattered and directed toward the opposite side of the semiconductor devices 32A and 32B is blocked by the second partition plate 35B.

If the semiconductor device 32C fails to operate properly, a current value converted by the semiconductor device 32C becomes lower. Based on the current value transmitted by the current sensor, the controller 71 determines that the semiconductor device 32C failed to operate properly. The controller 71 causes the opening switch 46 to be in an open state and separates off the semiconductor device 32C and the electric motor 25B from an object to be controlled.

However, since the wheels 21 are rotated by the alternating current converted by the semiconductor device 32B, the railroad vehicle 1 runs without interruption.

As described above, in the power converter 31 according to the embodiment, even in a case where the semiconductor device 32C that failed to operate properly and was shattered and scattered is directed toward the semiconductor devices 32A and 32B, the semiconductor device 32C is blocked by the first partition plates 34A and 34B. Consequently, even in a case where the semiconductor device 32C on the first surface 33a of the heat receiving plate 33 fails to operate properly, it is possible to prevent the semiconductor devices 32A and 32B from being damaged. Since the plurality of the semiconductor devices 32A to 32C are fixed to one heat receiving plate 33, it is possible to reduce the power converter 31 in size.

The first partition plates 34A and 34B are fitted into the first grooves 53B and 53C formed on the heat receiving plate 33 and are thereby fixed to the heat receiving plate 33. Accordingly, in the case where the flow path 52 is formed at a portion of the heat receiving plate 33 on which the first partition plates 34A and 34B are fixed preferably interference to the flow path 52 due to formation of a through-hole at the portion does not occur, and it is possible to fix the first partition plates 34A and 34B to the heat receiving plate 33.

The power converter 31 includes the cover 36, the first partition plates 34A and 34B are fitted into the second grooves 56B and 56C formed on the cover 36, respectively, and the cover 36 is thereby fixed thereto. Since the first partition plates 34A and 34B are fixed by the cover 36 and the heat receiving plate 33 which are disposed to hold the first partition plates 34A and 34B therebetween, it is possible to reliably fix the first partition plates 34A and 34B to the heat receiving plate 33 and the cover 36. By use of the cover 36, the first electrical device 37A can be stacked thereon.

The first electrical device 37A is fixed on the second surface 36b of the cover 36. Even in a case where the semiconductor device 32C that failed to operate properly and was shattered and scattered is directed toward the first electrical device 37A, the semiconductor device 32C is blocked by the cover 36. Accordingly, even when the semiconductor device 32C fails to operate properly, it is possible to prevent the first electrical device 37A from being damaged.

The power converter 31 includes the second partition plates 35A and 35B. Even in a case where the semiconductor device 32C that failed to operate properly and was shattered and scattered is directed toward the outside of the second partition plates 35A and 35B, the semiconductor device 32C is blocked by the second partition plates 35A and 35B. Accordingly, even when the semiconductor device 32C fails to operate properly, components or the like that are provided outside the second partition plates 35A and 35B can be prevented from being damaged.

The power converter 31 includes the heat sink 38 that cools down the heat receiving plate 33 by means of the cooling fluid. The heat receiving plate 33 can be effectively cooled down by the cooling fluid having an electrical heating performance higher than cooling due to gas such as air or the like.

Moreover, in the railroad vehicle 1 according to the embodiment, it is possible to constitute the railroad vehicle 1 by use of the power converter 31 that prevents the semiconductor devices 32A and 32B from being damaged even in a case where the semiconductor device 32C on the first surface 33a of the heat receiving plate 33 fails to operate properly.

In other cases, the power converter 31 may not include the second partition plates 35A and 35B, the cover 36, the first electrical device 37A, and the heat sink 38.

As described below, a configuration of the power converter 31 according to the embodiment can be modified in various ways.

Figure 5:
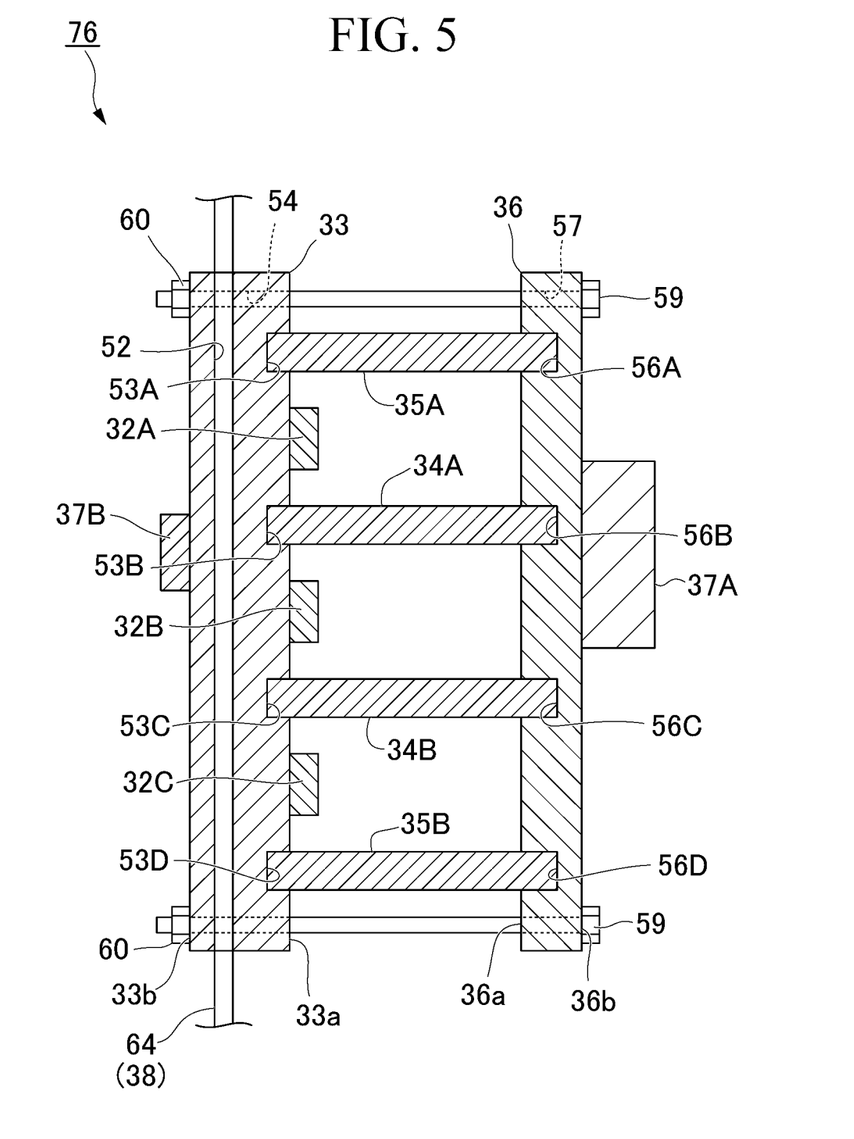
FIG. 5 is a cross-sectional view showing a relevant part of a power converter according to a modified example of an embodiment when viewed from a lateral side.

As shown in FIG. 5, a power converter 76 may include a second electrical device 37B fixed on a second surface 33b on an opposite side of the first surface 33a of the heat receiving plate 33 in addition to each configuration of the power converter 31. For example, the second electrical device 37B is a resistor and is electrically connected to the semiconductor devices 32A to 32C.

In the power converter 76 according to the modified example which is configured as described above, even in a case where the semiconductor device 32C that failed to operate properly and was shattered and scattered is directed toward the second electrical device 37B, the semiconductor device 32 is blocked by the heat receiving plate 33. Consequently, even in a case where the semiconductor device 32C failed to operate properly, it is possible to prevent the second electrical device 37B from being damaged.

Figure 6:
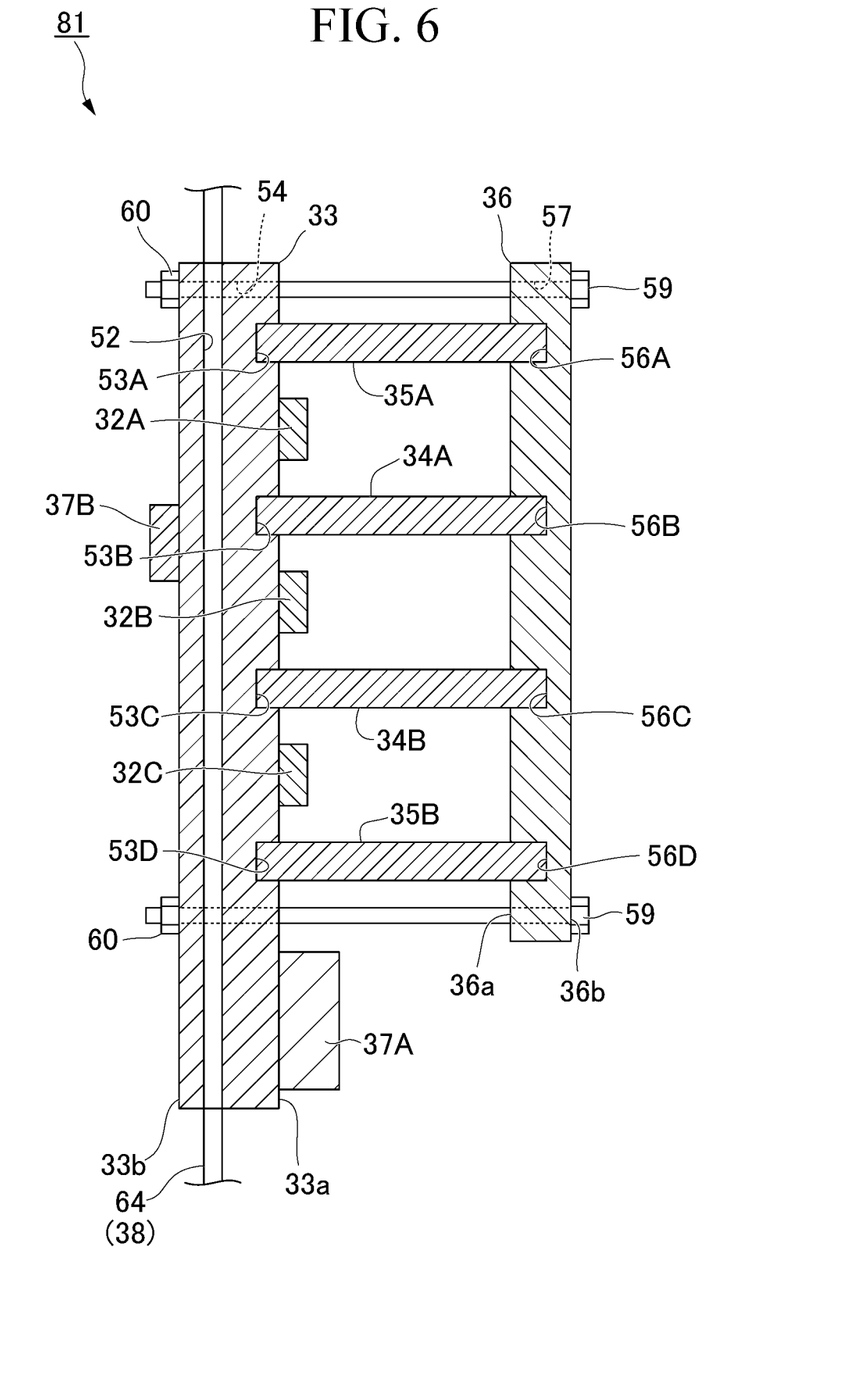
FIG. 6 is a cross-sectional view showing a relevant part of a power converter according to a modified example of an embodiment when viewed from a lateral side.

As shown in FIG. 6, in a power converter 81, the first electrical device 37A that configures the power converter 76 may be fixed to the first surface 33a of the heat receiving plate 33. In the modified example, the heat receiving plate 33 is formed longwise at the semiconductor device 32C side with respect to the semiconductor device 32A.

The first electrical device 37A is disposed at the opposite side of the semiconductor device 32B with respect to the semiconductor device 32C, i.e., on the outside of the second partition plates 35A and 35B. The first electrical device 37A and the semiconductor device 32C are partitioned by the second partition plate 35B.

In the power converter 81 according to the modified example which is configured as described above, even in a case where the semiconductor device 32C that failed to operate properly and was shattered and scattered is directed toward the first electrical device 37A, the semiconductor device 32C is blocked by the second partition plate 35B. Accordingly, even when the semiconductor device 32C fails to operate properly, it is possible to prevent the first electrical device 37A from being damaged. Furthermore, not only the semiconductor devices 32A to 32C but also the first electrical device 37A can be disposed on the first surface 33a of the heat receiving plate 33.

Figure 7:
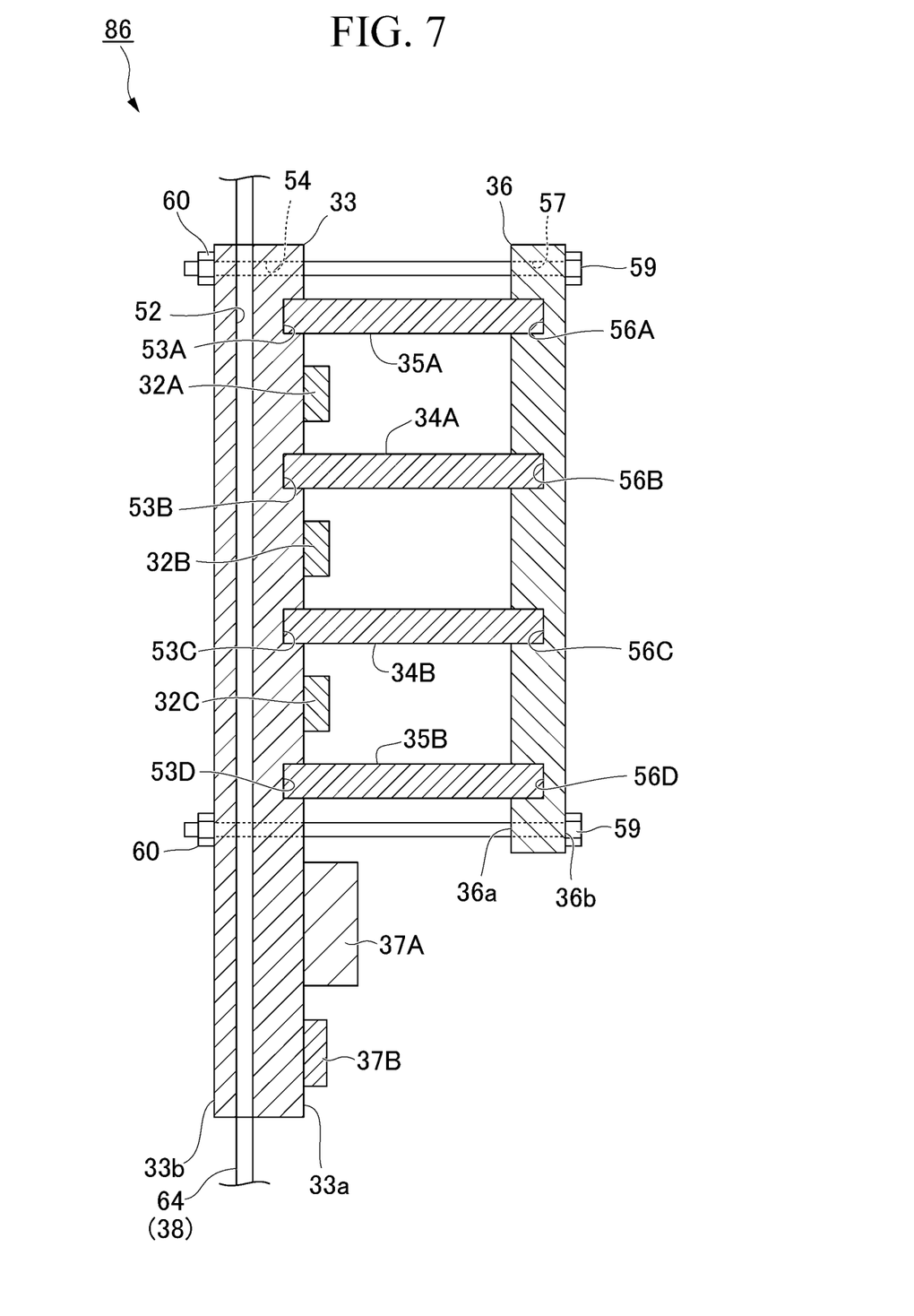
FIG. 7 is a cross-sectional view showing a relevant part of a power converter according to a modified example of an embodiment when viewed from a lateral side.

As shown in FIG. 7, in a power converter 86, the second electrical device 37B of the power converter 81 may be fixed on the first surface 33a of the heat receiving plate 33. In the modified example, the second electrical device 37B is disposed at the opposite side of the semiconductor device 32C with respect to the first electrical device 37A.

In the power converter 86 according to the modified example which is configured as described above, even in a case where the semiconductor device 32C that failed to operate properly and was shattered and scattered is directed toward the electrical devices 37A and 37B, the semiconductor device 32C is blocked by the second partition plate 35B. Accordingly, even when the semiconductor device 32C fails to operate properly, it is possible to prevent the electrical devices 37A and 37B from being damaged. Moreover, the semiconductor devices 32A to 32C and the electrical devices 37A and 37B (power converter 86) can be disposed so as to be thin in the thickness direction of the heat receiving plate 33.

Figure 8:
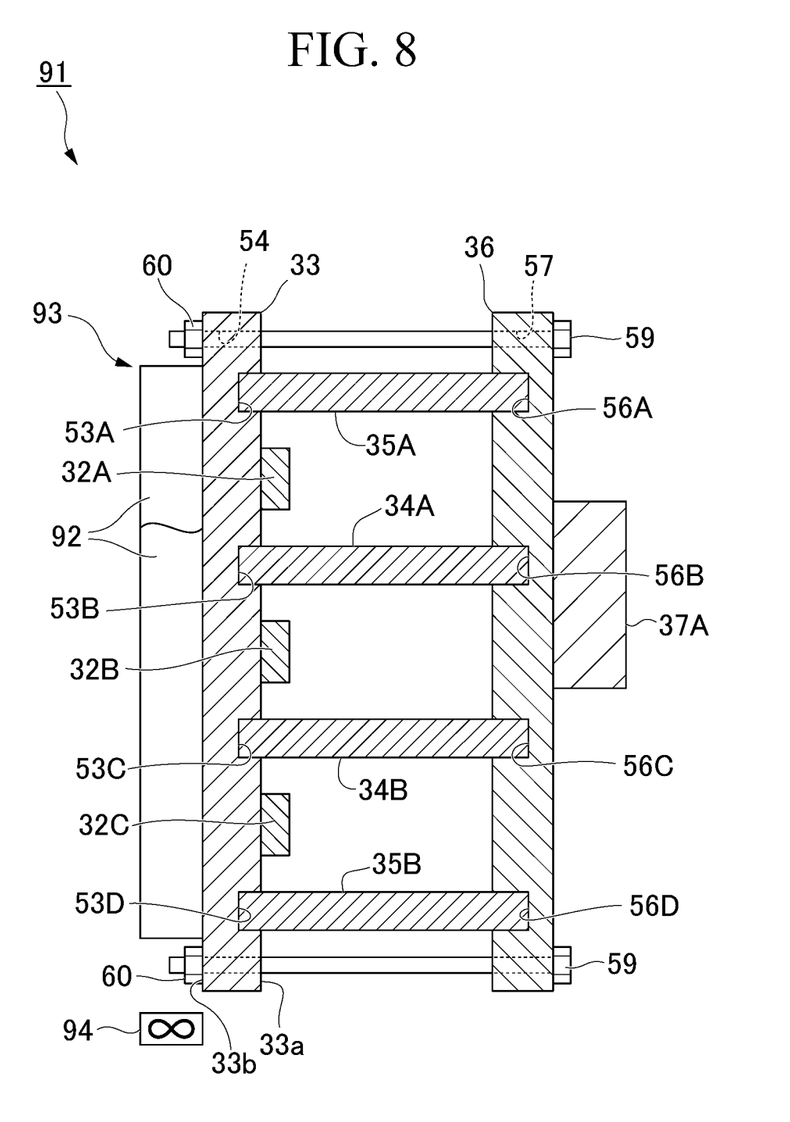
FIG. 8 is a cross-sectional view showing a relevant part of a power converter according to a modified example of an embodiment when viewed from a lateral side.

As shown in FIG. 8, a power converter 91 may include a plurality of fin members (protrusions) 92 instead of the heat sink 38 of the power converter 31. The plurality of the fin members 92 and the heat receiving plate 33 constitute the heat sink 93 with a heat-radiation fin system. The fin members 92 protrude from the second surface 33b of the heat receiving plate 33 in the thickness direction of the heat receiving plate 33. The fin members 92 preferably extend in a vertical direction along the longitudinal direction of the heat receiving plate 33 and are spaced apart at a distance to each other in the width direction of the heat receiving plate 33.

Note that, the number of the fin members 92 to be provided on the heat receiving plate 33 is not limited, and the number of the fin members 92 may be one.

In the power converter 91 according to the modified example which is configured as described above, heat generated from the semiconductor devices 32A to 32C is transferred to the air near the heat sink 93 via the heat receiving plate 33 and the fin members 92. When the heat is transferred to the air, the semiconductor devices 32A to 32C are cooled down.

The air heated by the heat sink 93 expands, and the density thereof becomes low. The low density air passes through between the fin members 92 or the like adjacent to each other in the width direction of the heat receiving plate 33 and moves upward. The heat sink 93 is cooled down by a so-called natural convection cooling.

In the power converter 91 according to the modified example which is configured as described above, since cooling fluid is not used for the heat sink 93, it is possible to reduce the size of the heat sink 93.

In other cases, the power converter 91 may include a blower 94 that causes air to flow to the heat sink 93. For example, the blower 94 causes air to flow upward along the fin members 92. In this case, the heat sink 93 is cooled down by a so-called forced-convection cooling, and cooling performance thereof is improved as compared with natural convection cooling.

Figure 9:
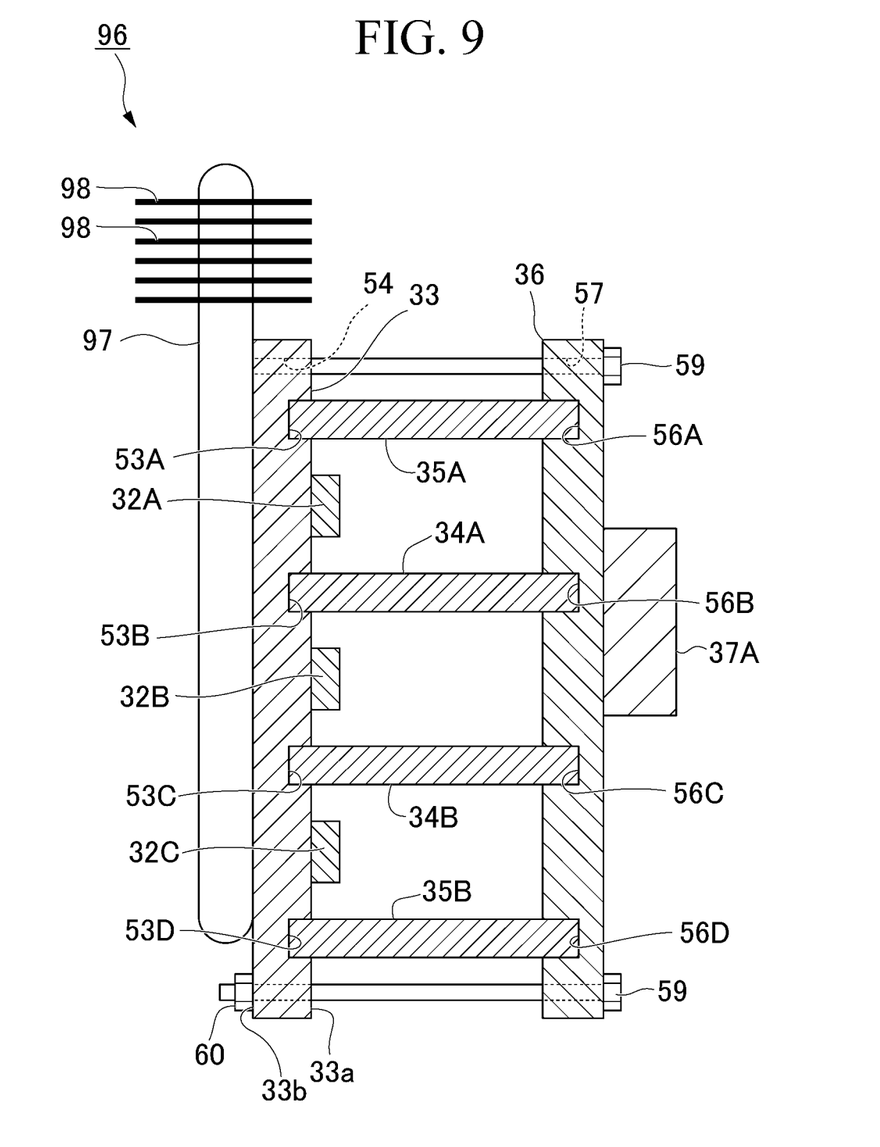
FIG. 9 is a cross-sectional view showing a relevant part of a power converter according to a modified example of an embodiment when viewed from a lateral side.

As shown in FIG. 9, a power converter 96 may include a heat pipe 97 that cools down the heat receiving plate 33 instead of the heat sink 38 of the power converter 31. For example, the heat pipe 97 is disposed so as to extend in a vertical direction. A lower end of the heat pipe 97 is fixed to the second surface 33b of the heat receiving plate 33. It is preferable that a plurality of fin members 98 be fixed to an upper end of the heat pipe 97. Working fluid such as an alternative for chlorofluorocarbon is sealed in the heat pipe 97.

In the power converter 96 according to the modified example which is configured as described above, heat generated from the semiconductor devices 32A to 32C is transferred to the lower end of the heat pipe 97 via the heat receiving plate 33. When the heat is transferred to the heat pipe 97, the semiconductor devices 32A to 32C are cooled down.

The working fluid inside the lower end of the heat pipe 97 is vaporized by the transferred heat and thereby becomes a working gas. The density of the working gas becomes low, and the working gas moves to the inside of an upper end of the heat pipe 97. The fin members 98 take heat from the working gas that moved to the inside of the upper end of the heat pipe 97. The working gas from which heat is taken out is liquefied and becomes working fluid. The density of the working fluid becomes high, and the working fluid moves to the lower end of the heat pipe 97.

As mentioned above, the semiconductor devices 32A to 32C can be effectively cooled down by utilizing heat of vaporization of the working fluid of the heat pipe 97.

Particularly, instead of the heat pipe 97, the power converter 96 according to the modified example may include a heat sink that carries out cooling by limiting and expanding a working gas with a high temperature and a high pressure made by a compressor.

Note that, in the embodiment, the first partition plate 34A is fitted into the first groove 53B formed on the heat receiving plate 33 and is thereby fixed to the heat receiving plate 33. However, the first partition plate 34A may be fixed by bolts or the like on the heat receiving plate 33 and to a through-hole that is provided at a portion of the heat receiving plate 33 in which the flow path 52 is not formed when seen in a front view. In this case, the heat receiving plate 33 is not formed on the first groove 53B. The same applies to the first partition plate 34B.

The first partition member is the first partition plates 34A and 34B, and the second partition member is the second partition plates 35A and 35B. However, shapes of the first partition plates 34A and 34B and the second partition plates 35A and 35B are not limited to a plate shape but may be a block shape or the like.

According to at least one embodiment described above, when the first partition plates 34A and 34B are provided, even when one of the semiconductor devices 32A to 32C on the first surface 33a of the heat receiving plate 33 fails to operate properly, it is possible to prevent another semiconductor device from being damaged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the inventions. The accompanying claims and their equivalents are intended to cover such forms or modifications as would fall within the scope of the inventions.

What is claimed is:

1. A power converter comprising:
   a plurality of semiconductor devices that constitute a power conversion unit;
   a heat receiving plate that has a first surface supporting the semiconductor devices;
   a first partition member that is fixed to the heat receiving plate and partitions the semiconductor devices; and
   a cover that is provided such that the cover and the heat receiving plate hold the first partition member therebetween, wherein
   the cover has a second groove formed thereon, and the first partition member is fitted into the second groove and is thereby fixed to the cover.

2. The power converter according to claim 1, wherein the heat receiving plate has a first groove formed thereon, and the first partition member is fitted into the first groove and is thereby fixed to the heat receiving plate.

3. The power converter according to claim 1, further comprising a first electrical device that is fixed to the cover on an opposite side of the semiconductor devices.

4. The power converter according to claim 1, further comprising a pair of second partition members that are fixed to the heat receiving plate and are provided to sandwich an entirety of the semiconductor devices therebetween.

5. The power converter according to claim 4, further comprising a first electrical device that is fixed to an outside of the pair of the second partition members on the first surface of the heat receiving plate.

6. The power converter according to claim 1, further comprising a second electrical device that is fixed to a second surface of the heat receiving plate on an opposite side of the first surface.

7. The power converter according to claim 1, further comprising a heat sink that cools down the heat receiving plate by cooling fluid.

8. The power converter according to claim 1, further comprising a protrusion that protrudes from the heat receiving plate.

9. The power converter according to claim 1, further comprising a heat pipe that cools down the heat receiving plate.

10. A railroad vehicle comprising the power converter according to claim 1.

11. A power converter comprising:

a plurality of semiconductor devices that constitute a power conversion unit;

a heat receiving plate that has a first surface supporting the semiconductor devices;

a first partition member that is fixed to the heat receiving plate and partitions the semiconductor devices; and a second electrical device that is fixed to a second surface of the heat receiving plate on an opposite side of the first surface.

12. The power converter according to claim 11, wherein the heat receiving plate has a first groove formed thereon, and the first partition member is fitted into the first groove and is thereby fixed to the heat receiving plate.

13. The power converter according to claim 11, further comprising a pair of second partition members that are fixed to the heat receiving plate and are provided to sandwich an entirety of the semiconductor devices therebetween.

14. The power converter according to claim 13, further comprising a first electrical device that is fixed to an outside of the pair of the second partition members on the first surface of the heat receiving plate.

15. The power converter according to claim 11, further comprising a heat sink that cools down the heat receiving plate by cooling fluid.

16. The power converter according to claim 11, further comprising a protrusion that protrudes from the heat receiving plate.

17. The power converter according to claim 11, further comprising a heat pipe that cools down the heat receiving plate.

\* \* \* \* \*